(12) United States Patent
Goldstein

(10) Patent No.: US 6,884,361 B2
(45) Date of Patent: Apr. 26, 2005

(54) METHOD FOR MAKING A MIRROR FOR PHOTOLITHOGRAPHY

(75) Inventor: Michael Goldstein, Ridgefield, CT (US)

(73) Assignee: Intel Corporation, Santa Clara, CA (US)

( * ) Notice: Subject to any disclaimer, the term of this patent is extended or adjusted under 35 U.S.C. 154(b) by 620 days.

(21) Appl. No.: 09/964,876

(22) Filed: Sep. 26, 2001

(65) Prior Publication Data

US 2003/0057178 A1 Mar. 27, 2003

(51) Int. Cl.$^7$ .................................................. C23F 1/00
(52) U.S. Cl. ............................. 216/2; 216/89; 216/90; 216/97; 216/99; 216/100
(58) Field of Search ............................ 216/2, 89, 90, 216/97, 99, 100

(56) References Cited

U.S. PATENT DOCUMENTS

| 5,272,744 | A | | 12/1993 | Itou et al. ................... 378/35 |
| 5,978,441 | A | | 11/1999 | Early ......................... 378/34 |
| 6,048,652 | A | | 4/2000 | Nguyen et al. ............... 430/5 |
| 6,159,643 | A | * | 12/2000 | Levinson et al. ............. 430/5 |
| 6,159,824 | A | | 12/2000 | Henley et al. .............. 438/455 |
| 6,368,942 | B1 | * | 4/2002 | Cardinale ................... 438/459 |

* cited by examiner

Primary Examiner—Nadine G. Norton
Assistant Examiner—Binh X. Tran
(74) Attorney, Agent, or Firm—Mark V. Seeley

(57) ABSTRACT

A method for making a substrate for a mirror used in photolithography is described. That method comprises forming a crystalline layer on a first layer, which has a low coefficient of thermal expansion. Part of the crystalline layer is then removed to form on the first layer a second layer that has a high quality surface finish.

9 Claims, 1 Drawing Sheet

METHOD FOR MAKING A MIRROR FOR PHOTOLITHOGRAPHY

FIELD OF THE INVENTION

The present invention relates to methods for making mirrors used in photolithography for making semiconductor devices. In particular, the present invention relates to methods for creating ultra-smooth surfaces on mirror blanks that have a very low coefficient of thermal expansion ("CTE"), which may be used to make mirrors for extreme ultraviolet ("EUV") lithography.

BACKGROUND OF THE INVENTION

Because polished fused silica disks—traditionally used to make mirrors for imaging systems—have a relatively high CTE, mirrors made from them may deform, when subjected to heat generated during EUV illumination. Likewise, silicon wafers that have been considered for use as EUV mirror substrates may have an unacceptably large CTE. For that reason, both fused silica and silicon may not be suitable for making mirrors used in EUV lithography systems. When transmitting light onto such optical components, even slight warpage of the mirror's substrate, which can result from expansion upon heating, can cause a beam to be reflected from the mirror in an unintended direction.

Certain low CTE materials may be used instead to form mirror blanks. Although such materials' thermal and mechanical properties may make them more suitable than fused silica or silicon for making mirrors for EUV lithography, it may be difficult to give them the required high quality surface finish. To a certain extent, advanced polishing processes can reduce surface roughness, and adding a reflective multi-layer coating to the mirror blank may temper the impact of an uneven surface topology. Nonetheless, these material's irregular surface characteristics can cause light scatter in EUV imaging systems and remain a serious issue for EUV lithography.

Further advancements in polishing processes may not provide a satisfactory solution to this problem for the following reason. Certain low CTE mirror blank materials (e.g., those sold under the tradename ZERODUR® by Schott Glass Technologies) are composed primarily of silicates, e.g., orthosilicates, pyrosilicates, and metasilicates. The size of the crystallites, which make up these materials' quasi-random matrix, may impose upon them an inherent surface roughness that must exceed the 0.1 nanometer root mean square ("RMS") roughness that EUV lithography lens designers desire. Because advancements in polishing techniques cannot change these crystallites' size, they can reduce the surface roughness of mirror blanks made from these materials to a limited extent only. Mirror blanks made from alloys are affected by grain boundaries, which also may limit how effectively advanced polishing processes can reduce surface roughness.

Accordingly, there is a need for an improved method for making a mirror for photolithography that includes a low CTE substrate. There is a need for such a method that reduces the surface roughness of that substrate. The present invention provides such a method for making such a mirror.

DETAILED DESCRIPTION OF THE PRESENT INVENTION

Figure 1A:
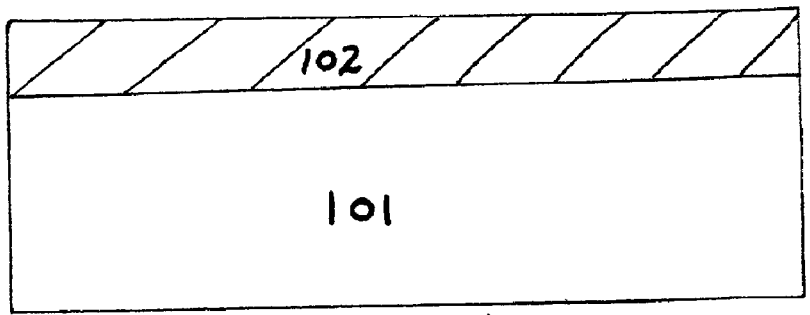
FIGS. 1a–d represent cross-sections of structures that may be made, when carrying out the method of the present invention for making a mirror for photolithography.

The present invention relates to a method for making a substrate for a mirror used in a photolithographic process for making a semiconductor device. That method includes the following steps. First, a crystalline layer is formed on a first layer, which has a low coefficient of thermal expansion. Part of that crystalline layer is then removed to form on the first layer a second layer that has a high quality surface finish. The present invention also relates to a method for making a mirror for photolithography that includes such a substrate.

In the following description, specific details are set forth such as material types, dimensions, etc., to provide a thorough understanding of the present invention. However, it will be apparent to those skilled in the art that the invention may be practiced in many ways other than those expressly described here. The invention is thus not limited by the specific details disclosed below.

FIGS. 1a–d represent cross-sections of structures that may be made, when carrying out the method for making a mirror of the present invention. Initially, that method requires forming crystalline layer 102 on first layer 101. First layer 101 has a low coefficient of thermal expansion and a peak-to-peak roughness—which reflects a relatively significant amount of surface topology variation—that should be reduced. First layer 101 preferably has a CTE that is substantially less than 0.5 ppm/° C. at 25° C. Even more preferably, first layer 101 may be made, at least in part, from materials having an ultra low CTE, e.g., a CTE of less than about 0.1 ppm/° C. at such temperatures. Such materials include certain titanium silicate glasses, such as the glass sold under the tradename ULE® by Corning, Inc., and certain glass ceramics, such as the glass sold under the tradename ZERODUR® by Schott Glass Technologies. Such materials may have a surface roughness that significantly exceeds the 0.1 nanometer RMS roughness that EUV lithography lens designers target—even after being polished using today's most advanced polishing techniques.

Table 1 compares CTEs reported for these materials with the CTEs reported for fused silica and silicon at various temperatures.

TABLE 1

| Material | CTE (ppm/° C.) | Temperature (° C.) |
| --- | --- | --- |
| Silicon | 2.616 | 27 |
| Silicon | 3.25 | 127 |
| Fused silica | 0.5 | 27 |
| ULE | +/−0.015 | 5–35 |
| ZERODUR | +/−0.05 | 0–50 |

In a preferred embodiment of the present invention, first layer 101 should be polished and cleaned prior to forming crystalline layer 102 on its surface. Process steps conventionally employed to polish and clean such materials may be used. Crystalline layer 102 preferably comprises silicon or re-crystallized polysilicon. Although such materials are preferred for making crystalline layer 102, those skilled in the art will recognize that other materials may be used instead. When crystalline layer 102 comprises silicon or re-crystallized polysilicon, silicon or polysilicon is initially deposited on the surface of first layer 101, e.g., by using a conventional physical vapor deposition, ion assisted deposition, or magnetron sputtering process. Whether silicon or polysilicon is formed initially will depend upon the process used to deposit layer 102. When that process forms a polysilicon layer, that layer must be re-crystallized, e.g., by applying a conventional annealing treatment, prior to the subsequent oxidation step—described in more detail below.

Layer 101 should be thick enough to provide adequate structural support for the mirror. The optimum thickness for that layer will vary depending upon mirror size, as will be apparent to those skilled in the art. Layer 102, when initially formed on layer 101, must be thick enough to enable part of it to be removed (i.e., the part that is subsequently oxidized), while enabling a portion of that layer to remain. The remaining portion will provide a high quality surface finish for the resulting mirror blank. When formed, layer 102's thickness may be on the order of 50 nanometers. As indicated below, however, depositing a layer that is between about 10 and about 15 nanometers thick should be adequate for most applications. (In some embodiments, it may be desirable to form a buffer layer between layers 101 and 102 to reduce stress, match lattice constants, or enhance adhesion between those layers.)

Following formation of crystalline layer 102 on first layer 101, a standard sequence of cleaning steps may be performed to remove particles and organic materials from the surface of layer 102, which could have been deposited on that surface during handling. After such a cleaning process (or immediately after forming layer 102 on top of layer 101 if cleaning steps are omitted), part of layer 102 is oxidized. In a preferred embodiment, a conventional rapid thermal anneal process is used to oxidize part of that layer.

When layer 102 comprises silicon, part of it is oxidized to form silicon dioxide. Preferably, the thickness of the resulting silicon dioxide layer should be on the order of several times the magnitude of the peak-to-peak roughness of layer 101. For example, if the distance between the highest and lowest points (or regions) at layer 101's surface is about 1 nanometer or less, then a silicon dioxide layer of several nanometers should be grown. To ensure that a silicon dioxide layer of that thickness may be generated from layer 102, while enabling part of that layer to be retained, layer 102 should have a thickness that is at least about 10 nanometers, when initially deposited. (When the thickness of layer 102 is slightly greater than 10 nanometers, the silicon dioxide layer that is grown from it must be less than about 10 nanometers thick.)

Figure 1B:
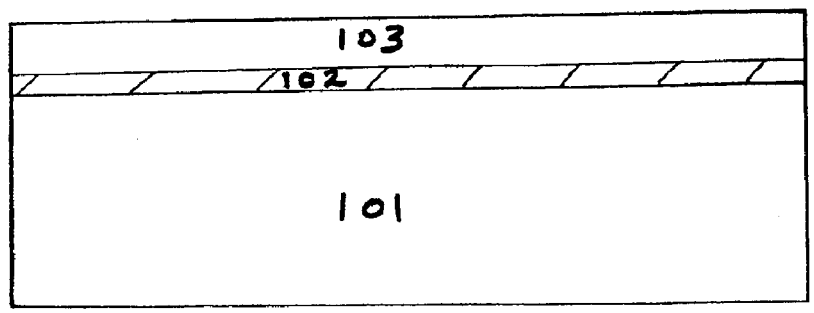

The oxidation step generates the structure shown in FIG. 1b, in which oxide 103 is created on the surface of the remaining portion of layer 102. Because such a process works by isotropic diffusion, the more elevated regions of layer 102 oxidize at a faster rate. This ensures that the oxide will penetrate deeper into layer 102 at those regions. When the oxide is subsequently removed, the resulting difference in oxide thickness (i.e., thicker at the "peaks" formed on layer 102's surface, and thinner at the "valleys" formed on that surface) will give the remaining portion of layer 102 a more planar surface, when compared to the surface of that layer as it existed prior to the oxidation and removal steps.

After oxide 103 is formed from part of layer 102, it is removed using a conventional isotropic etch step. When layer 102 comprises silicon and oxide 103 comprises silicon dioxide, that isotropic etch step should be selective for silicon dioxide 103 over silicon. Substrate 104, shown in FIG. 1c, results. Substrate, or mirror blank, 104 comprises layer 101 and the unoxidized remaining portion of layer 102. Preferably, the portion of the crystalline layer that remains after the silicon dioxide layer is removed is at least about 2 nanometers thick, and more preferably has a thickness that is on the order of several nanometers.

Figure 1C:
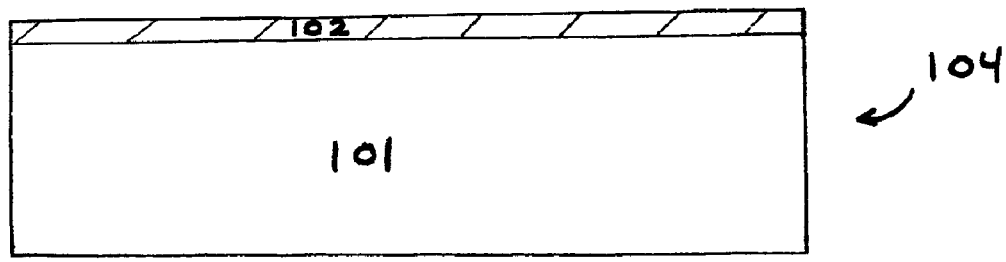

As shown in FIG. 1c, mirror blank 104 includes relatively thick low CTE layer 101 and relatively thin surface layer 102. The minimum peak-to-peak surface roughness, which crystalline layer 102's lattice constant imposes, may be 20% or less of the minimum peak-to-peak surface roughness, which low CTE layer 101's relatively large crystallites dictates. For that reason, surface layer 102 may give substrate 104 a comparatively high surface quality, ensuring that the resulting mirror blank has both a low CTE and a high quality surface finish. These properties may render mirror blank 104 suitable for making a mirror used in imaging systems for performing EUV photolithography. Because the resulting surface will be very smooth and flat, it should not be necessary to apply any subsequent polishing treatment to ensure that the surface of mirror blank 104 is substantially free of unacceptable deviations in surface topology.

Figure 1D:
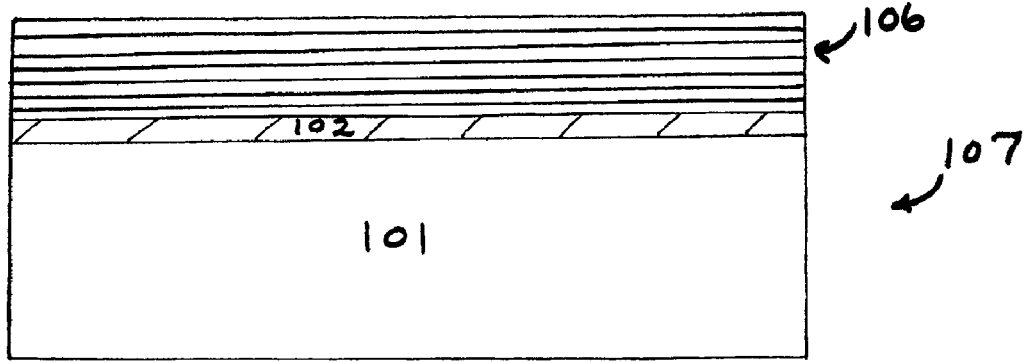

Substrate 104 may be used to make mirror 107, illustrated in FIG. 1d. Mirror 107 includes multi-layer coating 106, which has been formed on substrate 104. Multi-layer coating 106 preferably comprises thin sheets of alternating heavy and light element materials, which may be used to create a resonant reflecting mirror surface. The number of sheets, their thickness, and the types of materials used may depend upon the particular application to which multi-layer coating 106 (and the mirror that includes it) will be employed. Between about 20 and about 100 sheets of alternating molybdenum and silicon, each having a thickness that is preferably between about 20 and about 120 angstroms, should be suitable for EUV applications that employ wavelengths between about 5 and about 25 nm, such as a wavelength of about 13 nm. Although molybdenum is preferred for making the heavy element sheets included in multi-layer coating 106, other materials may be used instead, such as ruthenium, rhodium, tungsten, rhenium, nickel or chromium. Although silicon is preferred for the light element sheets, other materials that may be used include beryllium, boron or carbon.

The method of the present invention thus enables creation of a substrate that has a low CTE, and a reduced surface roughness. A mirror blank made in accordance with the described method may have a substantially defect free surface that has a sub-angstrom RMS surface roughness. The availability of a mirror blank with reduced surface roughness may be especially important when making a mirror that includes a multi-layer coating, as such a coating should be formed on a very flat substrate. Because the method of the present invention enables manufacture of a mirror blank that has a low CTE substrate and a high quality surface finish, such a method may enable manufacture of mirrors for EUV lithography.

An improved method for making a substrate for a mirror used in a photolithographic process for making a semiconductor device has been described. This method forms a thin layer, which has a high quality surface finish, on a low CTE layer. The resulting mirror blank may be used to make mirrors for advanced photolithographic processes, e.g., those that apply EUV lithography. Features shown in the above referenced drawings are not intended to be drawn to scale, nor are they intended to be shown in precise positional relationship. Additional steps and/or components that may be included or used in the method of the present invention have been omitted as they are not useful to describe aspects of the present invention.

Although the foregoing description has specified a method that includes certain steps, those skilled in the art will appreciate that many modifications and substitutions may be made. Although the method of the present invention may be used to make mirrors for imaging equipment, e.g., equipment used in EUV lithography, it may also be used to make a wide variety of stepper or scanner masks and mirrors for use in reflective lithography. The method of the present invention may be applied to one or more layers, which are included in the above-described multi-layer coating, to generate a layer (or layers) that has a smoother surface. Such a layer should be deposited initially at a sufficient thickness to enable part of it to be oxidized, while ensuring that the thickness of the remaining unoxidized portion meets the multi-layer coating's thickness requirement. A mirror blank, made in accordance with the method described above, may support a single layer reflective coating instead of a multi-layer coating. The method of the present invention is not limited to oxidizing part of a crystalline layer, then removing the oxidized portion to create a surface layer that has a high quality surface finish. A process that converts part of the crystalline layer into a sacrificial layer in some other way, prior to removing it, is considered encompassed by the present invention. Likewise, the method of the present invention contemplates a process that deposits on a low CTE layer a material that can be polished well by direct methods (e.g., electropolishing, wet etching, ion milling, etc . . . ). In such a process, it will not be necessary to oxidize part of that layer prior to removing the oxidized portion. Accordingly, it is intended that all such modifications, alterations, substitutions and additions be considered to fall within the spirit and scope of the invention as defined by the appended claims.

What is claimed is:

1. A method for making a substrate for a mirror used in a photolithographic process for making a semiconductor device comprising:

polishing and cleaning a first layer which has a low coefficient of thermal expansion and that comprises a low CTE glass or a low CTE alloy that is selected from the group consisting of a titanium silicate glass and a ceramic glass;

forming a crystalline layer that comprises silicon on the first layer;

forming a sacrificial layer that comprises silicon dioxide, which is grown by applying a rapid thermal anneal process to oxidize part of the crystalline layer; and then removing the sacrificial layer.

2. The method of claim 1 wherein the silicon dioxide layer is grown to a thickness of less than about 10 nanometers.

3. The method of claim 2 wherein the silicon dioxide layer is removed using an Isotropic etch process.

4. The method of claim 3 wherein the portion of the crystalline layer that remains after the silicon dioxide layer Is removed is at least about 2 nanometers thick.

5. A method for making a mirror for photolithography comprising:

polishing and cleaning a low CTE layer that comprises a low CTE glass or a low CTE alloy that is selected from the group consisting of titanium silicate glass and a ceramic glass;

forming a silicon containing layer on the low CTE layer;

applying a rapid thermal anneal process to convert part of the silicon containing layer into a sacrificial layer that comprises silicon dioxide;

removing the sacrificial layer, and then forming a multi-layer coating on the remaining portion of the silicon containing layer.

6. The method of claim 5 further comprising growing the silicon dioxide layer to a thickness of loss than about 10 nanometers.

7. The method of claim 6 wherein the silicon dioxide layer is removed using an isotropic etch process.

8. The method of claim 7 wherein the multi-layer coating comprises alternating layers of molybdenum and silicon.

9. A method for making a mirror for photolithography comprising: polishing and cleaning a low CTE layer that comprises a low CTE glass or a low CTE alloy that is selected from the group consisting of a titanium silicate glass and a ceramic glass;

forming a silicon containing layer on the low CTE layer;

oxidizing the silicon containing layer to form a sacrificial silicon dioxide layer by applying a rapid thermal anneal process to grow a silicon dioxide layer that is less than about 10 nanometers thick;

removing the silicon dioxide layer using an isotropic etch process; and then forming on the remaining portion of the silicon containing lever a multi-layer coating that comprises alternating layers of molybdenum and silicon.

* * * * *

UNITED STATES PATENT AND TRADEMARK OFFICE
CERTIFICATE OF CORRECTION

PATENT NO. : 6,884,361 B2
DATED : April 26, 2005
INVENTOR(S) : Goldstein

It is certified that error appears in the above-identified patent and that said Letters Patent is hereby corrected as shown below:

Column 6,
Line 22, delete "loss" and insert -- less --.
Line 42, delete "lever" and insert -- layer --.

Signed and Sealed this

Fifth Day of July, 2005

JON W. DUDAS
*Director of the United States Patent and Trademark Office*